United States Patent [19]

Rapp

[11] 4,175,988
[45] Nov. 27, 1979

[54] MELT-FORMED POLYCRYSTALLINE CERAMICS AND DOPANT HOSTS CONTAINING PHOSPHORUS

[75] Inventor: James E. Rapp, Oregon, Ohio

[73] Assignee: Owens-Illinois, Inc., Toledo, Ohio

[21] Appl. No.: 933,294

[22] Filed: Aug. 14, 1978

Related U.S. Application Data

[62] Division of Ser. No. 887,264, Mar. 16, 1978, Pat. No. 4,141,738.

[51] Int. Cl.$^2$ .......................................... H01L 21/223
[52] U.S. Cl. .................................. 148/189; 106/39.6; 106/73.2; 148/22; 148/186; 252/950; 252/951
[58] Field of Search ............................. 106/39.6, 73.2; 148/189, 22; 252/950, 951

[56] References Cited

U.S. PATENT DOCUMENTS

| | | | |
|---|---|---|---|
| 3,961,969 | 1/1976 | Rapp | 252/951 X |
| 4,033,790 | 7/1977 | Gunjigake et al. | 148/189 X |

*Primary Examiner*—G. Ozaki
*Attorney, Agent, or Firm*—Charles S. Lynch; M. E. Click; D. H. Wilson

[57] ABSTRACT

Disclosed are new polycrystalline ceramic bodies formed from melts containing as essential components $P_2O_5$, $Ta_2O_3$ and $Al_2O_3$ and sometimes containing small amounts of $SiO_2$. Also disclosed are such bodies in the form of planar dopant hosts for doping silicon or germanium with phosphorus. Methods of making both products are disclosed as well as how to use the dopant hosts in a doping process.

9 Claims, No Drawings

MELT-FORMED POLYCRYSTALLINE CERAMICS AND DOPANT HOSTS CONTAINING PHOSPHORUS

This application is a division of application Ser. No. 887,264 filed Mar. 16, 1978, now U.S. Pat. No. 4,141,738.

In U.S. Pat. No. 3,998,668 to Florence et al. there are disclosed crystalline ceramic materials containing mainly $Al_2O_3$ and $P_2O_5$ useful as dopant hosts for the vapor phase doping of semi-conductors, notably P-type silicon wafers or discs, or chips. The practical use of these materials has been limited because of their relatively high coefficient of linear thermal expansion. Thus, unless great and time consuming care is taken in the thermal handling of such dopant hosts in wafer form, they are subject to breakage due to stress caused by thermal history.

The new melt-formed polycrystalline ceramic bodies of the present invention are the result of an attempt to make phosphorus dopant host sources that would have a lower linear coefficient of thermal expansion and thus be more practical because of their greater resistance to thermal shock.

It is an object of the present invention to provide new melt-formed polycrystalline ceramic materials containing phosphorus oxide.

It is a further object of the present invention to provide such ceramic materials having a low average linear coefficient of thermal expansion.

It is a further object to provide new phosphorus-containing planar dopant hosts.

A still further object of the invention is to provide a method of making such new ceramic bodies, i.e., new ceramic materials.

Another object is to provide a method of making new phosphorus-containing planar dopant hosts.

Still another object is to provide a new method of doping semiconductors with phosphorus using said new planar dopant hosts.

Other objects, as well as aspects and advantages, of the present invention will become apparent from a study of the accompanying disclosure and claims.

According to the present invention there are provided melt-formed polycrystalline ceramic materials containing as the sole essential constituents $P_2O_5$, $Ta_2O_5$ and $Al_2O_3$ and optionally containing small amounts of $SiO_2$ and $La_2O_3$, as follows:

TABLE I

| Oxide | Mole Percent |
| --- | --- |
| $P_2O_5$ | 45-75 |
| $Al_2O_3$ | 11-28 |
| $Ta_2O_5$ | 6.5-13 |
| $SiO_2$ | 0-20 |
| $La_2O_3$ | 0-7 | where $P_2O_5 + Al_2O_3 + Ta_2O_5$ is at least 75 mole percent of the composition and the mole ratio $P_2O_5/Al_2O_3$ is at least 2. The mole percent $P_2O_5$ is usually not over 73. Usually, also, $SiO_2 + La_2O_3$ is at least 2 mole percent.

When not enough $Ta_2O_5$ is present only a glass is formed and this glass is not only of a high expansion but has the temperature-viscosity characteristics of a glass. On the other hand, the ceramics of the invention remain rigid at elevated temperatures.

In carrying out my invention it has been found that, within the composition range given in Table I above, a preferred range is as follows:

TABLE II

| Oxide | Mole Percent |
| --- | --- |
| $P_2O_5$ | 57-75 |
| $Al_2O_3$ | 12-20 |
| $Ta_2O_5$ | 7.5-13 |
| $SiO_2$ | 0-13 |
| $La_2O_3$ | 0-6 | where $P_2O_5 + Al_2O_3 + Ta_2O_5$ is at least 86 mole percent and $SiO_2$ plus $La_2O_3$ is at least 2 mole percent of the composition. Both $SiO_2$ and $La_2O_3$ help lower the temperature necessary to melt the compositions, and in applying the dopant sources to my process of doping both of these oxides seem to aid in releasing $P_2O_5$ from the source at the doping temperature. The mole percent $P_2O_5$ in the compositions of Table II is usually not over 73.

According to a method of the present invention suitable compositions containing appropriate raw materials are melted to form a homogeneous melt containing as essential ingredients $P_2O_5$, $Ta_2O_5$ and $Al_2O_3$ and optionally contaning small amounts of $SiO_2$ and $La_2O_3$ as set forth in the above table.

Melting is usually effected at temperatures in the range from 2900° to 3100° F., but in some instances lower temperatures may suffice and in others it may be necessary to employ higher temperatures, keeping in mind that a completely molten condition and a homogeneous melt is the objective. Melting can suitably be done in an electric or a gas-fired furnace, in silica or in platinum, for instance. The melt can be allowed to cool in its melting container, or it can be cast in a suitable shape and allowed to cool. During cooling the melt solidifies and crystallizes at least partially.

The product of the foregoing process are melt-formed polycrystalline ceramic materials or bodies of the present invention. These ceramics have an average linear coefficient of expansion of less than $32 \times 10^{-7}$/°C. over the range from zero to 300° C. and less than $42 \times 10^{-7}$/°C. over the range from zero to 700° C.

By melt-formed ceramics is meant that the polycrystalline ceramics are formed by crystallization on cooling from the melt. By polycrystalline ceramics is meant that the product has a myriad of small crystals. These crystals are in random orientation and thus the expansion coefficient of the product is essentially the same in all directions.

The products of the invention are not necessarily entirely crystalline and in fact are usually only partially crystalline and are believed to be at least 20 volume percent crystalline.

The ceramics of the present invention can be cast in structural shapes such as wall tile, etc., or structural shapes can be machined from them. Other structural uses that take advantage of the high abrasion resistance of the ceramics include cast centrifugal pump housings and impellors; also ceramic pipe for carrying hot and/or abrasive slurries. Other uses for the melt-formed polycrystalline ceramics include cast electrical insulators. When general structural ceramics is the end use for the ceramics, the compositions can contain amounts of other oxides that do not shift the coefficient of expansion outside the values specified herein and do not prevent the formation of the crystals and thus result in formation of a glass on cooling instead of a polycrystalline ceramic.

The most important use for the ceramics of the invention now known, however, are as phosphorus dopants for semiconductor materials in the manner of the use of the aluminum metaphosphate dopants described in said U.S. Pat. No. 3,998,668 in connection with FIGS. 1 to 3 and the description thereof in column 4 through column 8, line 36, which are incorporated herein by reference. For use as a semiconductor dopant source of phosphorus it is essential not only that oxides affecting formation of the polycrystalline ceramics having the specified expansion characteristics be limited but also that high vapor pressure materials be excluded or held to an absolute minimum, including all of the alkali metal oxides and other high vapor pressure metal oxides such as the oxides of lead, copper, tin, boron and antimony; otherwise, such impurity oxides in the vapor phase can contribute undesirable conductivity characteristics to the resulting semi-conductor. Thus, the use of very high purity batch materials is called for when planar dopant hosts are to be prepared from the ceramic bodies of the invention.

If the ceramic material of the invention is to be used for vapor phase diffusion doping of semiconductor materials, the ceramic material is cut into flat (planar) shapes—circular, rectangular, triangular or any other suitable geometric shape, although they are usually in the form of flat discs or wafers from 2 to 6 inches in diameter and having a thickness of no more than 0.2 inches. As used herein, the ceramic bodies of such shapes are what is meant by "planar dopant hosts."

Thus, a most important aspect of the present invention relates to the making of diffused-junction type semiconductor devices, and especially to a new method for diffusing phosphorus into silicon and germanium semiconductors. More particularly, the present invention pertains to a precise and readily controllable method for diffusing a phosphorus-containing layer in at least a portion of the surface of a silicon or germanium semiconductor for the purpose of forming a semiconductor junction therein.

Semiconductors have been known in the industry for many years, and the term semiconductor element has been considered generic to silicon, germanium and silicon-germanium alloys. As used herein, the term "semiconductor" is intended to mean such silicon, germanium and silicon-germanium alloy semiconductor elements. Such elements can be circular, rectangular or triangular or any other convenient geometric shape, although they are usually in the form of a wafer or disc in most commercial situations.

Such silicon semiconductors have an active impurity incorporated therein during manufacture or later by diffusion, which impurity affects the electrical conduction characteristics of the semiconductor as distinguished from other impurities which may have no appreciable effect on those characteristics. Active impurities are usually classified as donor impurities or acceptor impurities. The donor impurities include phosphorus, arsenic and antimony and the acceptor impurities include boron, gallium, aluminum and indium. In other cases, the silicon semiconductors are essentially free of such impurities and are called "intrinsic" semiconductors.

With respect to the nomenclature used in the semiconductor art, a zone of semiconductor material containing an excess of donor impurities and yielding an excess of free electrons is said to exhibit N type conductivity. On the other hand, P type conductivity is exhibited by a zone containing an excess of acceptor impurities resulting in a deficit of electrons or an excess of "holes". In other words, N type conduction is characterized by electron conduction whereas a P type conduction is one characterized by hole conduction. Intrinsic (sometimes called I type) silicon semiconductors contain neither donor or acceptor impurities.

When a continuous solid specimen of semiconductor material has an N type zone adjacent to P type zone, the boundary between them is termed a P-N or N-P junction and the specimen of semiconductor material is termed a P-N junction semiconductor device. When a zone of P type conductivity is adjacent a zone of greater P type conductivity, the junction is called a P-P+ junction. When a zone of N type conductivity is adjacent a zone of greater N type conductivity, the junction is called an N-N+ junction. Semiconductor junctions of the P-I type and N-I type also exist. The present invention encompasses the diffusion doping with phosphorus to form N (including "N+") zones in the above types of semiconductor devices.

Semiconductors have application and utility for purpose such as rectifiers, transistors, photodiodes, solar batteries, semiconductor controlled rectifiers and other devices. In addition to general electronic applications, the P-N junction semiconductor is frequently used as a radiation detector or charged particle detector.

Various developments have taken place in the prior art to effect the doping of the semiconductor material by the addition of dopant impurities while the silicon crystal is being pulled from a melt or by applying alloying and diffusing methods to a growing crystal. In general, the diffusion of the doping substance into the silicon material is effected by heating a predetermined quantity of the particular dopant together with the silicon so that the dopant atoms will permeate from all sides into the semiconductor body.

Commonly assigned U.S. Pat. No. 3,998,668 discloses a method of phosphorous doping of silicon, discussed above.

Methods involving deposition of a dopant on a limited surface area of the semiconductor body are described in U.S. Pat. No. 3,287,187. This prior art method requires the deposition of an oxide of the semiconductor material by vapor deposition followed by diffusion of the doping substance into the semiconductor surface area by heating the semiconductor body.

Silicon devices containing a diffused P-N junction have been made by heating P-type silicon chips or wafers in the presence of a phosphorus compound such as phosphorus pentoxide. The phosphorus pentoxide is believed to form a glassy film over the surface of the wafer and then the $P_2O_5$ is reduced to elemental phosphorus which diffuses into the silicon. The phosphorus could also be deposited on the surface of the silicon wafer at a low temperature and then heated to a temperature at which diffusion will take place.

Another method of diffusing phosphorus oxide into a semiconductor crystal is shown in U.S. Pat. No. 3,540,951, wherein the source of the phosphorus compound is produced by fusing an alkaline earth phosphate and phosphorus pentoxide. Illustratively, the fusion product of tertiary calcium phosphate and phosphorus pentoxide is used and it is said to yield reproducible results for doping semiconductor crystals of silicon.

However, when a mixture of calcium phosphate and phosphorus pentoxide is used containing appreciable phosphorus pentoxide, the material would be a molten glass or at best a molten mass at normal doping temperatures ranging from 900° C. to 1200° C. This would necessitate containing the phosphate mixtures or salts in a boat or crucible in a temperature zone typically lower than that required for diffusion after the doping process takes place. Two different temperature zones or two different reaction conditions would thereby be involved if this particular prior art method were followed. The requirement for containing molten materials in a boat or crucible drastically reduces the number of silicon chips which can be treated simultaneously in a uniform temperature zone and further complicates the procedures.

Another approach described in the prior art for doping a wafer of semiconductive silicon involves the use of vapors of ammonium phosphate. U.S. Pat. No. 2,974,073 discloses a method wherein the vapors of ammonium phosphate are employed and is reported to form a glassy phosphorus containing surface film over the wafer. It is said that some phosphorus diffuses from the film into the wafer to form a phosphorus diffused N-type surface on the wafer. Commercially used doping temperatures commonly fall within the range from 900° C. to 1200° C. and at these temperatures, the ammonium phosphate would decompose completely rendering it useful for only a single doping. These properties would necessitate temperature zones typically lower than that required for diffusion after the doping process takes place. U.S. Pat. No. 2,974,073 shows that a convenient method of performing the step is to utilize a two-zone furnace. The requirement for maintaing two different temperature zones or two different reaction temperatures places an unwanted burden on the commercial practice of this method.

Hot-pressed rare earth phosphate solid diffusion sources are disclosed in U.S. Pat. No. 4,033,790 assigned to Denki Kagaku Kogyo Kabushiki, but the assignee's literature describes these sources by saying that "The weak point of these source wafers is the relatively low thermal shock resistance. Slow heating and cooling rate is necessary to avoid cracking of source wafers." This is obviously a time consuming and expensive drawback.

Similarly, a hot-pressed mixture of silicon phosphate and zirconium phosphate is disclosed as a solid diffusion source in U.S. Pat. No. 3,954,525 assigned to The Carborundum Company, but this source has been withdrawn from the market because it is "so sensitive to temperature variations" (private communication from the assignee company dated Oct. 19, 1977).

The present process of doping semiconductors according to my invention overcomes the difficulties and drawbacks of prior art methods utilizing liquid or molten sources of phosphorus oxide and methods requiring a two-zone furnace, two furnaces or two different temperature treatments. The method of this invention depends in principle on a solid, oxidized source of phosphorus for deposition on the silicon surface followed by a subsequent reaction with the silicon at high temperature. This reaction reduces the deposited compound to elemental phosphorus which in turn diffuses to a controlled depth into the wafer. The concentration and the depth of the junction is proportional to the time and temperature of the doping and the diffusing operation. Applicant's invention resides in using a different source of the oxidized phosphorus with its attendant advantages. The present process has the advantages set forth for the aluminum phosphate source of U.S. Pat. No. 3,998,668 and is also advantageous over the process using that source because the lower expansion coefficients of the present dopant hosts decreases the chance for wafer breakage due to thermal shock during normal use, which advantage my process also enjoys relative to the sources disclosed in said U.S. Pat. Nos. 4,033,790 and 3,954,525.

In accordance with my process of doping semiconductors, a suitable procedure is as follows:

A suitable P-type silicon substrate, such as a wafer, is prepared by any of the known techniques of obtaining monocrystalline bodies of silicon. For example, a monocrystalline ingot may be formed of highly purified silicon. Then the ingot is cut into transverse slices and the slices are diced to form silicon wafers of the desired dimension. The surface of the substrate may be prepared by suitable cleaning and polishing. However, the polished and cleaned semi-conductive silicon materials may be commercially purchased. Polishing or cleaning of the surface may be accomplished by mechanical means such as lapping or the like or by chemical means, such as etching which is well understood in the art and does not form a part of the present invention.

For conventionally grown crystals, the surface may be chemically polished with a suitable etchant, for example a concentrated solution of three parts hydrofluoric acid, three parts acetic acid and five parts nitric acid, by volume. Alternatively, the surface may be prepared by lapping or etching with a hot solution of water containing about 10% sodium hydroxide at ambient temperature and up to about 90° C. These cleaning and etching operations function for the purpose of removing contaminants from the surface and to make the surface uniform with a high degree of smoothness. These preparatory operations are well understood in the art.

The P-type silicon starting material may be one which is doped with any of the known acceptor-type impurities such as boron, aluminum, gallium, or indium. The impurity concentration in the starting material is primarily determined by the required characteristics in the device to be fabricated.

Formation of P-N junctions of the present invention have been found to occur to a desirable extent on P-type silicon having a resistivity in the range of 13 ohm-centimeters. It is, of course, readily apparent that the precise size and nature of the wafer is not critical. For example, wafers conventionally used may be 1, 2 or 3 inches in diameter or even more. The thickness may range from 5 to 20 mils, although this may vary. Typical wafers are 8 to 10 mils thick. Likewise, the resistivity of suitable P-type silicon starting materials ranges from about 3 to about 15 ohm-centimeters.

An oxide layer is grown on the surface of the silicon or other semi-conductor wafer in accordance with this invention. The wafer is heated in the fumes of $P_2O_5$ so that a film or coating is formed over at least a portion of the surface of the wafer. A mask or protective covering may be utilized so as to develop any pattern, as is understood in the art. The coating or film is of glassy nature and its composition may vary somewhat and is believed to be $P_2O_5$. In any event, the film does contain phosphorus in one form or another. The temperature of this operation is such that simultaneously some phosphorus diffuses from the film or deposit into the wafer forming a thin phosphorus diffused surface layer or region below the surface. A barrier or boundary layer is formed at the interface between the phosphorus diffused surface layer and the P-conductivity silicon wafer. The junction depth may vary, but in general, it is up to about 10 microns in thickness. The minimum thickness can vary and illustratively is about 0.1 micron.

Generally, the method of doping a semi-conductor wafer such as silicon in this embodiment of the process of the invention comprises diffusing phosphorus into a semi-conductor silicon element by positioning at least one semi-conductor silicon element in a furnace, positioning a solid melt-formed ceramic of the invention in wafer or disc form in the furnace in the vicinity of, but not in physical contact with the silicon element, and then subjecting the silicon element and the ceramic body to an elevated temperature in the range of 800° C. to 1200° C. At these temperatures the ceramic dopant host liberates $P_2O_5$ vapors which vapors then pass through the furnace and contact at least a portion of the surface of the silicon element. This process is conducted for a sufficient period of time to permit the diffusion of the phosphorus into at least one portion of the surface of the silicon element to form a diffused region therein.

After the $P_2O_5$ vapors react with the hot silicon surface, the elemental phosphorus diffuses into the silicon chip with continued heating.

As a further aspect to this embodiment of the invention, the doping process is further controlled and enhanced by the use of free-flowing inert carrier gas such as argon or nitrogen, where the flow is through the furnace in a direction normal to the wafer surfaces.

As used here, the expression "inert gas" means that the carrier gas does not enter into the chemical reaction between the $P_2O_5$ vapors and the hot silicon surface. Following the doping process, the diffusion depth can be further increased to bury the junction deeper by a simple heat treatment in an inert atmosphere. This may be carried out in a separate furnace if desired.

In a specific example of the invention a melt-formed polycrystalline ceramic of the following composition

EXAMPLE 1

| Oxide | Mole Percent |
|---|---|
| $P_2O_5$ | 67.2 |
| $Al_2O_3$ | 15.3 |
| $SiO_2$ | 4.9 |
| $Ta_2O_5$ | 9.6 |
| $La_2O_3$ | 3.0 | was made as follows:
The following batch components were melted:

| | Parts by Weight |
|---|---|
| Quartz[1] | 405.000[1] |
| Aluminum metaphosphate[2] | 10267.500[2] |
| Phosphoric acid[3] | 10420.000[3] |
| Tantalum oxide[4] | 6282.500[4] |
| Lanthanum oxide[5] | 1462.500[5] |

[1] $SiO_2$ 99.98%, $Al_2O_3$ 0.006%, $Fe_2O_3$ 0.0004%, $Na_2O$ 0.0014%, $K_2O$ 0.0005%, $Li_2O$ 0.0006%
[2] $Al_2O_3$ 22.6%, $P_2O_5$ 75.2%, $SiO_2$ 0.32%, $Fe_2O_3$ 0.0054%
[3] $P_2O_5$ 61.8%, $Fe_2O_3$ 0.0007%, balance essentially water.
[4] $Ta_2O_5$ 99.9%, $Fe_2O_3$ 0.0002%, $SiO_2$ 0.0225%; $WO_3$ 0.0032%
[5] $La_2O_3$ 99.9%, $Fe_2O_3$% 0.0005%
(Note: above percentages are in weight percent)

The batch components were mixed and the batch was melted in platinum in an electric furnace in an air atmosphere at furnace temperatures gradually raised from 2000° F. to 3000° F. over a 2 hour period where it was held at 3000° F. for 4 hours. The melt was then placed in another furnace where it was held for 4 hours at 1250° F., during which time the melt crystallized on cooling to a partially crystalline melt-formed ceramic. Its average linear coefficient of thermal expansion was $12 \times 10^{-7}$/°C. over the range from zero to 300° C. and was $19.7 \times 10^{-7}$/°C. over the range from zero to 700° C.

Wafers were cut from the ceramic billet so formed. They were about 2 inches in diameter and about 60 mils thick. These wafers were used to dope silicon wafers in the manner generally described in U.S. Pat. No. 3,998,668 in connection with FIGS. 1–3 therein. Different wafers were aged at 1050° C. and 1100° C. for various times and then were used to dope silicon wafers by placing them vertically in the fused silica rack in a furnace spaced apart from the surface of the silicon wafers about 0.1 inch. Nitrogen gas was slowly flowed through the furnace during the doping run. Doping temperatures were also at 1050° C. and 1100° C. for times of ½ hour and 1 hour. In the 1100° C. runs a 3 inch diameter fused silica furnace was used and a $N_2$ rate of 1 liter per minute was employed. In the 1050° C. runs a 4 inch diameter fused silica furnace and a $N_2$ rate of 3 liters per minute were used. The surface resistivity of the doped silicon samples in ohms per square was measured. Results were as follows:

| Hrs. Aged at 1100° C. | Resistivity (½ hr at 1100° C.) | Resistivity (1 hr at 1100° C.) |
|---|---|---|
| 90 | 6.2 | 4.1 |

| Hrs. Aged at 1050° C. | Resistivity (½ hr at 1050° C.) | Resistivity (1 hr at 1050° C.) |
|---|---|---|
| 138 | 7.9 | 4.2 |

These results illustrate the long life of the composition of this example. No difficulty with cracking from thermal shock was encountered.

Table III lists other examples of melt-formed polycrystalline ceramics of the invention made according to the process of the invention and having the properties of the ceramics of the invention hereinbefore discussed. In Table III $\alpha$ stands for the coefficient of thermal expansion as previously discussed. The resistivities given in Example 1 and in the examples of Table III are the values of surface resistivity in ohms per square obtained after aging (heating) wafers of the invention for the hours indicated in Table III at 1100° C. and then doping P-type silicon wafers therewith for one-half hour at 1100° C. in the manner described in Example 1. Surface testing was effected with a four-point conductivity probe, after etching the glassy film from the silicon surface with a 5 percent aqueous HF solution for about 30 to 60 seconds. The surface of compositions of Example 1 and of the examples of Table III all exhibited N-type conductivity.

Examples 1, 14 and 22, particularly Example 1, are at the present time believed to be the examples that fulfull the best mode requirement of 35 U.S.C. 112, first paragraph.

TABLE III

| Example: | 2 | 3 | 4 | 5 | 6 | 7 | 8 | 9 | 10 | 11 | 12 |
|---|---|---|---|---|---|---|---|---|---|---|---|
| Component | | | | | | | | | | | |

TABLE III-continued

| | | | | | | | | | | | |
|---|---|---|---|---|---|---|---|---|---|---|---|
| $P_2O_5$ | 68.3 | 66.3 | 66.8 | 66.3 | 67.2 | 67.2 | 69.6 | 61.2 | 63.5 | 63.6 | 63.2 |
| $Al_2O_3$ | 18.0 | 21.2 | 17.7 | 21.2 | 15.2 | 15.3 | 13 | 15.3 | 13 | 20.9 | 15.3 |
| $SiO_2$ | 0.5 | 2.5 | 0.4 | 2.5 | 2.4 | 0.4 | 0.3 | 10.4 | 10.4 | 2.5 | 7.4 |
| $Ta_2O_5$ | 10.3 | 8 | 10.1 | 6.5 | 10.1 | 10.1 | 10.1 | 10.1 | 10.1 | 10 | 10.1 |
| $Nb_2O_5$ | — | 2 | — | 3.5 | — | — | — | — | — | — | — |
| $La_2O_3$ | 2.9 | — | 5.0 | — | 5 | 7 | 7 | 3 | 3 | 3 | 4 |
| $\alpha \times 10^7$, (0–300° C.) | 21.6 | 15.2 | 26.2 | 20.1 | 26.7 | 25.2 | 27.9 | 9.8 | 8.5 | 21.4 | 9.6 |
| $\alpha \times 10^7$, (0–700° C.) | 33.4 | 27.1 | 26.9 | 27.8 | 30.2 | 24.0 | 23.5 | 17.5 | 18.9 | 19.0 | 13.5 |
| Aging time, Hrs | 75.5 | — | 48 | 19 | 35.5 | 18.5 | 89 | 2 | — | 20.5 | 16 |
| Resistivity | 4.9 | — | 6.0 | 4.3 | 4.1 | 2.7 | 5.5 | 2.9 | — | 6.2 | 3.5 |

| Example: | 13 | 14 | 15 | 16 | 17 | 18 | 19 | 20 | 21 | 22 | 23 |
|---|---|---|---|---|---|---|---|---|---|---|---|
| $P_2O_3$ | 63.5 | 62 | 61.9 | 62 | 62.3 | 62.8 | 62.3 | 63.2 | 62.3 | 62.8 | 63.2 |
| $Al_2O_3$ | 13 | 16.5 | 23.5 | 23.5 | 21.1 | 17.6 | 21.1 | 15.3 | 21.1 | 17.6 | 15.3 |
| $SiO_2$ | 5.9 | 9.5 | 2.1 | 2.1 | 2 | 2 | 6.6 | 6.4 | 6.6 | 6.5 | 3.9 |
| $Ta_2O_3$ | 12.6 | 10 | 10 | 10 | 10 | 10 | 10 | 10.1 | 8 | 10 | 12.6 |
| $Nb_2O_5$ | — | — | — | — | — | — | — | — | 2 | — | — |
| $La_2O_3$ | 5 | 2 | 2.5 | — | 2 | 5 | — | 5 | — | 3 | 5 |
| $ZrO_2$ | — | — | — | 2.5 | 2.5 | 2.5 | — | — | — | — | — |
| $\alpha \times 10^7$, (0–300° C.) | 14.5 | 24.0 | 20.4 | 14.4 | 21.3 | 19.2 | 21.0 | 24 | 26.5 | 23.5 | 16.6 |
| $\alpha \times 10^7$, (0–700° C.) | 18.2 | 30.6 | 14.4 | 23.5 | 20.6 | 14.0 | 27.4 | 24.6 | 32.1 | 25.2 | 19.4 |
| Aging time, Hrs | 32 | 130 | 18.5 | — | — | 6.5 | 17.5 | 1 | 0.5 | — | 43.5 |
| Resistivity | 4.0 | 6.0 | 4.7 | — | — | 7.1 | 8.7 | 2.5 | 2.7 | — | 4.9 |

| Example: | 24 | 25 | 26 | 27 | 28 | 29 | 30 | 31 | 32 | 33 | 34 |
|---|---|---|---|---|---|---|---|---|---|---|---|
| Component | | | | | | | | | | | |
| $P_2O_5$ | 62.6 | 64.8 | 62.8 | 65.2 | 60.5 | 64.8 | 60.8 | 63.2 | 62.5 | 62.4 | 56.8 |
| $Al_2O_3$ | 19.4 | 17.7 | 17.6 | 15.3 | 20 | 17.7 | 17.6 | 15.3 | 20 | 14.1 | 17.6 |
| $SiO_2$ | 0.5 | 2.4 | 4.5 | 6.4 | 6.5 | 4.5 | 8.4 | 8.4 | 4.5 | 11.4 | 15.5 |
| $Ta_2O_5$ | 12.5 | 10 | 10 | 10.1 | 10 | 10 | 10 | 10.1 | 10 | 10.1 | 10 |
| $Nb_2O_5$ | — | — | — | — | — | — | — | — | — | — | — |
| $La_2O_3$ | 5 | 5 | 5 | 3 | 3 | 3 | 3 | 3 | 3 | 2 | — |
| $\alpha \times 10^7$, (0–300° C.) | 15.2 | 20.11 | 20.4 | 11.9 | 17.3 | 13.4 | 14.2 | 14.9 | 18.9 | 13.4 | 11.2 |
| $\alpha \times 10^7$, (0–700° C.) | 15.5 | 16.4 | 40.6 | 19.7 | 24.1 | 19.2 | 17.6 | 22.9 | 23.1 | 21.2 | 19.7 |
| Aging time, Hrs | 16 | 40 | 55 | 17 | 16 | 20 | 42 | 17.5 | 0.5 | 59 | — |
| Resistivity | 9.3 | 3.2 | 5.3 | 2.8 | 3.1 | 3.3 | 3.3 | 3.0 | 2.4 | 4.9 | — |

| Example: | 35 | 36 | 37 | 38 | 39 | 40 | 41 | 42 | 43 | 44 | 45 |
|---|---|---|---|---|---|---|---|---|---|---|---|
| $P_2O_5$ | 56.9 | 57.2 | 56.9 | 64.9 | 63.2 | 64.8 | 65.2 | 66.8 | 64.8 | 64.8 | 66.8 |
| $Al_2O_3$ | 17.6 | 15.3 | 17.6 | 15.3 | 15.3 | 17.7 | 15.3 | 17.7 | 17.7 | 17.7 | 17.7 |
| $SiO_2$ | 13.5 | 15.5 | 12.5 | 4.4 | 3.9 | 5.5 | 4.4 | 2.5 | 0.4 | 3 | 3.5 |
| $Ta_2O_5$ | 10 | 10.0 | 10 | 10.4 | 10.1 | 10 | 10.1 | 10.1 | 10 | 12.6 | 10.1 |
| $Nb_2O_5$ | — | — | — | — | 2.5 | — | — | — | — | — | — |
| $La_2O_3$ | 2 | 2 | 3 | 3 | 5 | 2 | 5 | 3 | 5 | 2 | 2 |
| $ZrO_2$ | — | — | — | 2 | — | — | — | — | — | — | — |
| $\alpha \times 10^7$, (0–300° C.) | 22.1 | 22.6 | 20.3 | 18.6 | 17.4 | 12.6 | 13 | 15.0 | 21.3 | 18.6 | 16.2 |
| $\alpha \times 10^7$, (0–700° C.) | 27.3 | 29.4 | 21.1 | 21.5 | 34.6 | 19.7 | 16 | 21.2 | 13.6 | 21.7 | 19.1 |
| Aging time, Hrs | 18 | — | 18.5 | 40 | — | 18 | 0.25 | — | 1 | 7 | 17 |
| Resistivity | 4.4 | — | 4.5 | 5.7 | — | 12.5 | 2.3 | — | 3.0 | 4.8 | 3.8 |

| Example: | 46 | 47 | 48 | 49 | 50 | 51 | 52 | 53 | 54 | 55 | 56 |
|---|---|---|---|---|---|---|---|---|---|---|---|
| Component | | | | | | | | | | | |
| $P_2O_5$ | 68.6 | 62.8 | 64.9 | 64.8 | 66.8 | 69.2 | 67.2 | 64.4 | 65.7 | 62.8 | 63.2 |
| $Al_2O_3$ | 18.8 | 17.6 | 17.1 | 17.7 | 17.7 | 15.3 | 15.3 | 14.1 | 16.7 | 17.6 | 15.3 |
| $SiO_2$ | 0.5 | 2 | 0.4 | 4 | 1.9 | 3.4 | 4.4 | 10.4 | 0.4 | 5.5 | 7.4 |
| $Ta_2O_5$ | 10.1 | 12.6 | 12.6 | 11.6 | 11.6 | 10.1 | 10.1 | 9.1 | 11.2 | 11 | 11.1 |
| $GeO_2$ | — | — | — | — | — | — | — | — | 3 | — | — |
| $La_2O_3$ | 2 | 5 | 5 | 2 | 2 | 2 | 3 | 2 | 3 | 3 | 3 |
| $\alpha \times 10^7$, (0–300° C.) | 16.6 | 14.3 | 17.3 | 15.6 | 14.8 | 7.0 | 10.4 | 10.6 | 17.8 | 16.3 | 11.5 |
| $\alpha \times 10^7$, (0–700° C.) | 21.0 | 34.6 | 24.3 | 20.2 | 21.2 | 17.7 | 18.3 | 19.3 | 17.8 | 16.9 | 17 |
| Aging time, Hrs | — | 42 | 35.5 | — | — | — | — | — | 3 | — | 17 |
| REsistivity | — | 4.8 | 6.8 | — | — | — | — | — | 3.2 | — | 5.0 |

| Example: | 57 | 58 | 59 | 60 | 61 | 62 | 63 | 64 | 65 | 66 | 67 |
|---|---|---|---|---|---|---|---|---|---|---|---|
| $P_2O_5$ | 62.5 | 67 | 67.2 | 65 | 64.8 | 65 | 66.8 | 68.9 | 69.2 | 69.2 | 67.2 |
| $Al_2O_3$ | 20 | 16.5 | 15.3 | 16.5 | 17.7 | 16.5 | 17.7 | 17.1 | 15.3 | 15.3 | 15.3 |
| $SiO_2$ | 3.5 | 2.4 | 5.4 | 3.4 | 5.5 | 4.4 | 3.4 | 1.9 | 3.4 | 4.4 | 6.4 |
| $Ta_2O_5$ | 11 | 11.1 | 9.1 | 11.1 | 9 | 11.1 | 9.1 | 9.1 | 9.1 | 8.1 | 9.1 |
| $Nb_2O_5$ | — | — | — | — | — | — | — | — | — | — | — |
| $La_2O_3$ | 3 | 3 | 3 | 4 | 3 | 3 | 3 | 3 | 3 | 3 | 2 |
| $ZrO_2$ | — | — | — | — | — | — | — | — | — | — | — |
| $\alpha \times 10^7$, (0–300° C.) | 16.9 | 16.2 | 13.1 | 19.4 | 12.6 | 10.3 | 27.8 | 30 | 16.5 | 20.5 | 18.9 |
| $\alpha \times 10^7$, (0–700° c.) | 16.0 | 18.7 | 19.3 | 19.6 | 19.3 | 15.5 | 31.7 | 31.3 | 25.2 | 25.8 | 22.2 |
| Aging time, Hrs | 16.5 | — | — | — | — | 58 | 27.5 | 27.5 | 27.2 | — | — |
| Resistivity | 8.3 | — | — | — | — | 4.9 | 4.8 | 7.0 | 7 | — | — |

TABLE III-continued

| Example: | 68 | 69 | 70 | 71 | 72 | 73 | 74 | 75 | 76 | 77 | 78 |
|---|---|---|---|---|---|---|---|---|---|---|---|
| Component | | | | | | | | | | | |
| $P_2O_5$ | 72.2 | 70.7 | 70.4 | 72.5 | 66.8 | 70.7 | 69.2 | 65.2 | 69.5 | 69.2 | 72.5 |
| $Al_2O_3$ | 15.3 | 15.3 | 17.1 | 13.6 | 17.7 | 15.3 | 15.3 | 15.3 | 13 | 15.3 | 13.6 |
| $SiO_2$ | 0.4 | 1.9 | 0.4 | 1.8 | 2.9 | 1.4 | 2.9 | 6.9 | 4.9 | 5.4 | 2.9 |
| $Ta_2O_5$ | 9.1 | 9.1 | 9.1 | 9.1 | 9.6 | 9.6 | 9.6 | 9.6 | 9.6 | 8.1 | 8.1 |
| $Nb_2O_5$ | — | — | — | — | — | — | — | — | — | — | — |
| $La_2O_3$ | 3 | 3 | 3 | 3 | 3 | 3 | 3 | 3 | 3 | 2 | 3 |
| $\alpha \times 10^7$, (0-300° C.) | 27.6 | 28.5 | 29.4 | 24.8 | 28.1 | 27.4 | 26.1 | 21.5 | 21.8 | 20 | 26.1 |
| $\alpha \times 10^7$, (0-700° C.) | 29.8 | 36.8 | 32.1 | 33.5 | 31.8 | 32.8 | 30.3 | 27.9 | 28.5 | 24.8 | 31.5 |
| Aging time, Hrs | 56.5 | — | 2 | — | — | — | 38.5 | — | — | — | — |
| Resistivity | 7.8 | — | 3.0 | — | — | — | 6.5 | — | — | — | — |

| Example: | 79 | 80 | 81 | 82 | 83 | 84 | 85 | 86 | 87 | 88 | 89 |
|---|---|---|---|---|---|---|---|---|---|---|---|
| $P_2O_5$ | 67.2 | 67.2 | 69.2 | 67.2 | 46.7 | 47.7 | 56.3 | 56.3 | 61.6 | 56.8 | 51.3 |
| $Al_2O_3$ | 15.3 | 15.3 | 15.3 | 15.3 | 20.9 | 21.4 | 21.1 | 21.1 | 25.8 | 17.6 | 23.2 |
| $SiO_2$ | 2.9 | 3.4 | 0.9 | 4.2 | 17.5 | 15.9 | 10.1 | 12.5 | 2.6 | 10.5 | 10.5 |
| $Ta_2O_5$ | 9.6 | 9.1 | 9.6 | 9.3 | 10 | 7.7 | 10 | 10 | 10 | 15 | 10 |
| $ZrO_2$ | — | — | — | — | 5 | 7.2 | 2.5 | — | — | — | 5 |
| $La_2O_3$ | 5 | 5 | 5 | 4 | — | — | — | — | — | — | — |
| $\alpha \times 10^7$, (0-300° C.) | 26.8 | 29.9 | 26.6 | 27.1 | 12 | 16 | 15 | 19 | 20 | 7 | 16 |
| $\alpha \times 10^7$, (0-700° C.) | 34.5 | 34.5 | 25.2 | 29.8 | 16 | 20 | 22 | 25 | 25 | 14 | 19 |
| Aging time, Hrs | 21 | 137 | 21 | — | — | — | — | — | — | — | — |
| Resistivity | 3.2 | 6.4 | 3.2 | — | — | — | — | — | — | — | — |

| Example: | 90 | 91 | 92 | 93 | 94 | 95 | 96 | 97 | 98 | 99 |
|---|---|---|---|---|---|---|---|---|---|---|
| Component | | | | | | | | | | |
| $P_2O_5$ | 63.2 | 51.9 | 51.9 | 51.9 | 51.9 | 56 | 51.9 | 51.9 | 51.9 | 63.2 |
| $Al_2O_3$ | 15.3 | 17.6 | 17.6 | 17.6 | 17.6 | 23.4 | 17.6 | 17.6 | 17.6 | 26.4 |
| $SiO_2$ | 3.9 | 15.5 | 18 | 18 | 16.5 | 5.6 | 10.5 | 15.5 | 10.5 | — |
| $Ta_2O_5$ | 12.6 | 10 | 7.5 | 10 | 9 | 10 | 10 | 10.0 | 10 | 10.3 |
| $ZrO_2$ | — | 5 | 5 | 2.5 | 5 | 5 | 5 | 3 | 5 | 5 |
| $La_2O_3$ | 2 | — | — | — | — | — | — | 2 | 5 | — |
| MgO | — | — | — | — | — | — | 4.9 | — | — | — |
| CaO | 3 | — | — | — | — | — | — | — | — | — |
| $\alpha \times 10^7$, (0-300° C.) | 8 | 17 | 17 | 17 | 11 | 17 | 11 | 14 | 26 | 18.1 |
| $\alpha \times 10^7$, (0-700° C.) | 26.1 | 21 | 24 | 22 | 19 | 23 | 16 | 17 | 23 | 24.1 |
| Aging time, Hrs | — | 0.5* | — | — | — | — | — | — | — | — |
| Resistivity | — | 7.2 | — | — | — | — | — | — | — | 3.7 |

*doping at 1050° C.

The foregoing specific examples are of course not exhaustive but are merely illustrative.

The following Table IV shows melt-formed compositions in mole percentages, which compositions were glasses, not polycrystalline ceramics. Such compositions are of course outside the scope of the invention.

TABLE IV

| | Composition | | |
|---|---|---|---|
| Oxide | A | B | C |
| $P_2O_5$ | 69.7 | 66.3 | 62.3 |
| $Al_2O_3$ | 23.3 | 21.2 | 21.1 |
| $SiO_2$ | — | 2.5 | 6.5 |
| $Ta_2O_5$ | 5 | 5 | 5 |
| $Nb_2O_5$ | — | 5 | 5 |
| $La_2O_3$ | 2 | — | — |
| $\alpha \times 10^7$, (0-300° C.) | 47.0 | 48.2 | 47.3 |
| $\alpha \times 10^7$, (0-700° C.) | 49.5 | 51.5 | 50.3 |

It will be noted that in all cases the $Ta_2O_5$ was below that of the compositions of the invention. Note also that composition B is directly comparable to Examples 3 and 5. All three compositions have the same total mole percent of $Ta_2O_5$ plus $Nb_2O_5$ but the two examples of the invention have an amount of $Ta_2O_5$ greater than composition B. A similar comparison can be made between composition C and Examples 21 and 19.

The composition of the melt-formed polycrystalline ceramic bodies (and the dopant hosts made therefrom) of the present invention consist essentially of the oxides disclosed in Tables I and II. By "consist essentially of" or "consisting essentially of" said components it is meant that the named components are present in the mole percentages named, but the term also means that other inorganic oxides can be present in amounts that (1) do not destroy the polycrystalline character of the solid formed from the melt and (2) do not shift the overall coefficients of expansion outside the limits disclosed herein. A number of examples of Table III illustrate various oxides that are permissible components according to the foregoing criteria.

While the doping process of the invention has been particularly described with respect to making P-N junctions starting with P-type semiconductor material, the doping process of the invention is not so limited and for instance encompasses starting with semiconductor material having N-type conductivity and thus forming the N-N+ junctions discussed hereinfore.

As will be evident to those skilled in the art, various modifications of this invention can be made or followed in the light of the foregoing disclosure and discussion without departing from the spirit and scope of the disclosure or from the scope of the claims.

I claim:

1. In a process of doping a semiconductor wherein a semiconductor and a planar dopant host for vapor phase transport of $P_2O_5$ are maintained in vapor phase communication at a temperature and for a time sufficient to form a zone of N-type conductivity in said semiconductor, the improvement comprising using a dopant host which is a melt-formed polycrystalline ceramic body having an average linear coefficient of thermal expansion of less than $32 \times 10^{-7}$/°C. over the range from zero to 300° C. and less than 42×10⁻⁷/°C. over the range from zero to 700° C., said ceramic body having a composition consisting essentially of

| Oxide | Mole Percent |
| --- | --- |
| $P_2O_5$ | 45–75 |
| $Al_2O_3$ | 11–28 |
| $Ta_2O_5$ | 6.5–13 |
| $SiO_2$ | 0–20 |
| $La_2O_3$ | 0–7 | where $P_2O_5+Al_2O_3+Ta_2O_5$ is at least 75 mole percent of the composition and the mole ratio $P_2O_5/Al_2O_3$ is at least 2.

2. The process of claim 1 wherein said semiconductor is a P-type silicon semiconductor.

3. The process of claim 2 wherein said silicon semiconductor is contacted with an atmosphere consisting essentially of $P_2O_5$ vapors and a carrier gas for said $P_2O_5$ vapors.

4. In a process of doping a semiconductor wherein a semiconductor and a planar dopant host for vapor phase transport of $P_2O_5$ are maintained in vapor phase communication at a temperature and for a time sufficient to form a zone of N-type conductivity in said semiconductor, the improvement comprising using a dopant host which is a melt-formed polycrystalline ceramic body having an average linear coefficient of thermal expansion of less than $32\times10^{-7}$/°C. over the range from zero to 300° C. and less than $42\times10^{-7}$/°C. over the range from zero to 700° C., said ceramic body having a composition consisting essentially of

| Oxide | Mole Percent |
| --- | --- |
| $P_2O_5$ | 45–75 |
| $Al_2O_3$ | 11–28 |
| $Ta_2O_5$ | 6.5–13 |
| $SiO_2$ | 0–20 |
| $La_2O_3$ | 0–7 | where $P_2O_5+Al_2O_3+Ta_2O_5$ is at least 75 mole percent of the composition and the mole ratio $P_2O_5/Al_2O_3$ is at least 2 and $SiO_2+La_2O_3$ is at least 2 mole percent.

5. The process of claim 4 wherein said semiconductor is a P-type silicon semiconductor.

6. The process of claim 5 wherein said silicon semiconductor is contacted with an atmosphere consisting essentially of $P_2O_5$ vapors and a carrier gas for said $P_2O_5$ vapors.

7. In a process of doping a semiconductor wherein a semiconductor and a planar dopant host for vapor phase transport of $P_2O_5$ are maintained in vapor phase communication at a temperature and for a time sufficient to form a zone of N-type conductivity in said semiconductor, the improvement comprising using a dopant host which is a melt-formed polycrystalline ceramic body having an average linear coefficient of thermal expansion of less than $32\times10^{-7}$/°C. over the range from zero to 300° C. and less than $42\times10^{-7}$°C. over the range from zero to 700° C., said ceramic body having a composition consisting essentially of

| Oxide | Mole Percent |
| --- | --- |
| $P_2O_5$ | 57–75 |
| $Al_2O_3$ | 12–20 |
| $Ta_2O_5$ | 7.5–13 |
| $SiO_2$ | 0–13 |
| $La_2O_3$ | 0–6 | where $P_2O_5+Al_2O_3+Ta_2O_5$ is at least 86 mole percent and $SiO_2$ plus $La_2O_3$ is at least 2 mole percent of the composition and the mole ratio $P_2O_5/Al_2O_3$ is at least 2.

8. The process of claim 7 wherein said semiconductor is a P-type silicon semiconductor.

9. The process of claim 8 wherein said silicon semiconductor is contacted with an atmosphere consisting essentially of $P_2O_5$ vapors and a carrier gas for said $P_2O_5$ vapors.

* * * * *